(12) United States Patent  
Shih

(10) Patent No.: US 8,804,418 B1  
(45) Date of Patent: Aug. 12, 2014

(54) LOW OVERHEAD READ DISTURBANCE PROTECTION METHOD FOR NAND FLASH DEVICE

(75) Inventor: Alan Suntzi Shih, Cupertino, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 39 days.

(21) Appl. No.: 13/601,738

(22) Filed: Aug. 31, 2012

(51) Int. Cl.
*G11C 11/34* (2006.01)
*G11C 16/10* (2006.01)
*G11C 16/04* (2006.01)

(52) U.S. Cl.
CPC ............ *G11C 16/10* (2013.01); *G11C 16/0483* (2013.01)
USPC ................................ 365/185.02; 365/185.24

(58) Field of Classification Search
CPC ............................ G11C 16/10; G11C 16/0483
USPC ........................................ 365/185.02, 185.24
See application file for complete search history.

(56) References Cited

U.S. PATENT DOCUMENTS

2011/0038203 A1* 2/2011 Camp et al. .............. 365/185.02

\* cited by examiner

*Primary Examiner* — Michael Tran
(74) *Attorney, Agent, or Firm* — Sawyer Law Group, P.C.

(57) ABSTRACT

The present invention provides for a solution benefiting from providing for a method and system to reduce the impact of read disturbance while providing improved system performance through optimized activities with minimal impact to overhead. The present invention provides for a highly effective early page migration mechanism, prior to a manufacturer's endurance limit and without a forced block migration, to reduce read disturbance associated with traditional NAND-based memory architectures, in part by identifying a block counter value, determining a block threshold value and early migrating one or more pages of data from the original block location upon the satisfaction of certain criteria.

20 Claims, 3 Drawing Sheets

LOW OVERHEAD READ DISTURBANCE PROTECTION METHOD FOR NAND FLASH DEVICE

FIELD OF THE INVENTION

The present invention relates generally to the field of data processing, and more particularly, to effecting improvements in data processing operations and apparatuses by minimizing the effects of electrical disturbance events.

BACKGROUND OF THE INVENTION

In a typical computer-related apparatus, there is often a flash memory that is based on a NAND technology. A NAND-based flash memory subsystem typically comprises one or more flash memory chips, a memory controller for executing flash translation code (FTL) code in Read-Only Memory (ROM), a Static Read-Access Memory (SRAM) for maintaining the address mapping information, and a host interface for communicating, such as that of a Personal Computer Memory Card International Association (PCMCIA) for example. In operation, a flash memory device is able to issue commands in association with logical sector addresses of and data resident on the flash device. Within the architecture of the device, typically it is the FTL that translates the commands into basic operational commands of read, write, program and/or erase in relation to physical locations, or sector addresses, of the data (i.e., operational commands).

Flash memory is a popular type of non-volatile computer storage chip having a NAND-based architecture. Flash memories are typically found in memory cards, Universal Serial Bus (USB) flash drives, solid-state drives, and similar products, for general storage and transfer of data. NAND flash memory is also often used to store configuration data in numerous digital products. Example applications of flash memory include personal computers, PDAs, digital audio players, digital cameras, mobile phones, synthesizers, solid state storage, video games, scientific instrumentation, industrial robotics, routers, communication devices, programmable devices, medical electronics, and so on. Flash memory is popular in applications for consumers because of the robustness of the devices (i.e., shock and water resistance versus disc drives) as well as since flash memory offers fast read access times, as Its mechanical shock resistance helps explain its popularity over hard disks in portable devices; consequently, consumers often expect long-term performance from such devices and are often unfamiliar with the flash endurance limits and disturbance issues that may arise.

As used herein the term "NAND-based architecture" is intended to include those architectures and techniques for memory devices, systems and peripherals which are organized into a plurality of blocks where each block comprises a plurality of pages and each page typically defines an individually addressable physical memory location. Further "NAND-based architectures" are also intended to include any memory architecture, including implementations, in which read disturbance(s) or disturbance events resulting from retrieval of data may occur.

Typically, a flash memory drive is used to provide non-volatile storage to computer systems (such as a PC) by connection via a Universal Serial Bus (USB) or other bus. NAND is a common type of flash memory. Flash memory may be electrically erased and reprogrammed. Typically, the NAND-based architecture flash memory is programmed to read/write in pages, where it may be the entirety of the block that is erased when new data is written to the block or before data can be programmed (or written to) a block or memory cell. As a result, fairly large blocks of data are often erased before new data can be written or rewritten to the block, including some possibly invalid data.

However, the reliability of flash data is often affected by a number of factors including: block degradation, bit detection error, limited write/erase cycles and read disturbances. The block degradation can be addressed by bad block management (BBM) algorithms, the limited write/erase cycles can be addressed by wear leveling (WL) algorithms, and bit detection errors can be addressed by an error correction code (ECC). However, heretofore, read disturbances have not been effectively addressed.

Read disturbances, in particular, present situations for flash performances that result in poor reliability, unexpected bit errors, etc. Additionally, errors in the cell being read with each access and may often result in the same for cells adjacent or proximate to the read cell in blocks. Read disturbances may also become more prevalent where: a cell or page nears or exceeds its read disturbance endurance limit; a selected cell is read and another unaddressed cell is affected (e.g., degraded); a selected cell is read and another unaddressed erased cell is programmed; etc. Further, still other examples of failures related to read disturbance may include the loss of data to adjacent pages where there have been too many reads (or READs) or operational commands to proximate pages.

Manufacturers of the devices typically provide for a manufacturer's limit (i.e., flash endurance limit) where the manufacturer essentially guarantees operation of the gate to perform commands provided the associated gate has performed no more than a predetermined set number of command activities. For example a manufacturer of a flash memory may provide a data sheet that describes the minimal and nominal flash endurance limit (i.e., endurance limit) of their product to be a specific number of read/write cycles. The flash endurance limit is typically the measure of the ability of the flash memory product to perform as a function of accumulated nonvolatile data changes it has undergone during operation. Breaches of endurance limit are typically tracked in a flash memory system by a counter that counts the number of operational commands to a particular block (i.e. "block counter"). It will also be appreciated by those familiar with flash memories that a block is typically determined to be erased once the block counter is equal to or exceeds the flash endurance limit as the block may not function correctly thereafter. As a result, often once the flash endurance limit is reached for a block, the pages within that block and the block data are erased and moved to a new location, the counter for the block is reset to zero, and performance is lessened as is capacity of the device.

However, despite the inclusion of flash endurance limits and specification sheets, read disturbance may still cause interruption, errors, and unexpected performance failures to users of such devices. As a result, it is desirable to mitigate the impact of read disturbance to improve the performance and utility of the device and preferably to do so without overhead consequence. Prior efforts such as migrating data from blocks having high error code correction (ECC) count to another block so as to refresh the data, have been attempted, but do not overcome the challenges. Similarly, the use of a block counter also is also insufficient. Both of these approaches add additional overhead and further limit the utility of the system capacity.

Rather what is needed is a method and system to reduce the impact of disturbance without degrading system performance through optimized activities with minimum overhead consequence.

As used herein the terms device, apparatus, system, etc. are intended to be inclusive, interchangeable, and/or synonymous with one another and other similar arrangements and equipment for purposes of the present invention though one will recognize that functionally each may have unique characteristics, functions and/or operations which may be specific to its individual capabilities and/or deployment.

SUMMARY OF THE INVENTION

The present invention fulfills these needs and has been developed in response to the present state of the art, and in particular, in response to the problems and needs in the art that have not yet been fully solved by currently available technologies.

The present invention provides for a method of reducing read disturbance in a memory system comprising a flash memory having a NAND-based architecture, the method comprising the steps of: identifying a block counter value by reading the block counter of a block having a selected page to be READ, determining a block threshold value in relation to a read disturbance endurance limit value, comparing if the block counter value is equal to or greater than the block threshold value, where if the current block counter value is greater than or equal to the block threshold value, then moving the selected page to a new block location.

The present invention further provides for a method of reducing read disturbance in a memory device having a NAND-based architecture, the method comprising the steps of: identifying a block counter value of a block having a selected page to be READ to be less than a read disturbance endurance limit value, determining a block threshold value in relation to the read disturbance endurance limit value, comparing the block counter value to the block threshold value; and either: performing a move operation on the selected page to a new block location if the block counter value is greater than or equal to the block threshold value; or, otherwise performing an operational command on the selected page and updating the block counter value by one.

The present invention also provides for a flash memory system having a NAND-based architecture configured for reducing read disturbance, comprising: a memory device coupled to a memory controller, wherein the memory device includes a plurality of non-volatile memory storage cells, a counter configured to provide a block counter value of a number of times a block having a selected page is accessed for an operational command, a read disturbance endurance limit value resident in the memory device and associated with a performance of the memory device; a memory controller configured to identify the block counter value, identify the read disturbance endurance limit value, compare the block threshold value and the endurance limit value, and either: perform a move operation on the selected page to a new block location if the block counter value is greater than or equal to the block threshold value; or, perform an operational command on the selected page; and update the block counter value by one.

The present invention provides for a solution benefiting from providing for a method and system to reduce the impact of disturbance while providing improved system performance through optimized activities with limited to overhead. The present invention provides for a highly effective early page migration mechanism, prior to a manufacturer's endurance limit and without a forced block migration, to reduce read disturbance associated with traditional NAND-based memory architectures.

Further embodiments, forms, objects, features, advantages, aspects, and benefits of the present application shall become apparent from the detailed description and drawings included herein.

DETAILED DESCRIPTION

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
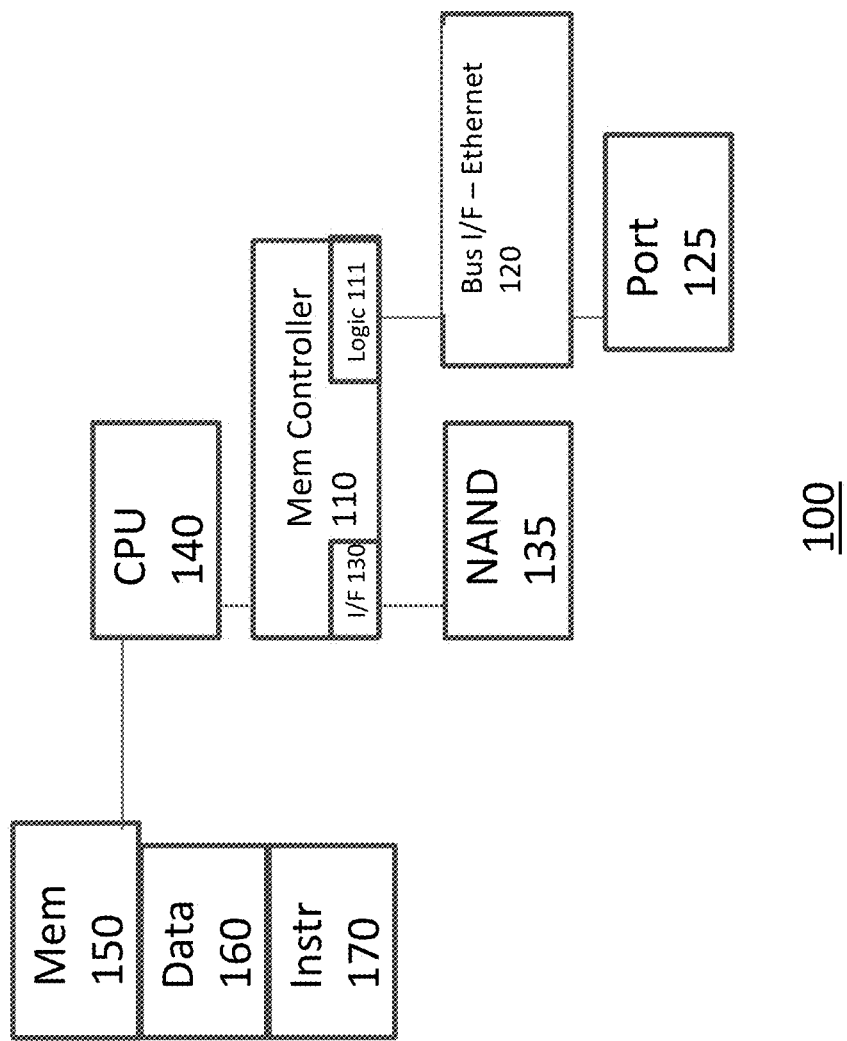
FIG. 1 sets forth an exemplary block diagram of a NAND flash memory system, in accordance with one embodiment of the present invention.

FIG. 1 sets forth an exemplary block diagram of a NAND flash memory system 100, in accordance with one embodiment of the present invention. From FIG. 1, the system includes a memory controller 110 having logic 111, a bus interface 120 for controlling data exchange to/from external connections 125 and/or busses. The bus interface may include one or more different interfaces. The memory controller may include a NAND flash interface 130 for interfacing with and managing one or more NAND flash memory devices 135. It will be understood by those skilled in the art that for NAND flash devices, read and programming (i.e., writing) operations take place on a page basis where there are typically three operational commands in a NAND-based architecture flash device: read a page, program a page and erase a block. From FIG. 1, a microprocessor 140 is also in communication with the memory controller 110 and a memory 150 where data 160 and instructions 170 reside. It will be further appreciated that the present invention is not limited to having data and instructions resident as set forth in the figure, where data and instructions may reside locally, remotely, in other logic and memory, or any combination, without traversing from the scope and utility of the present invention.

For NAND-based architecture memory systems, page size within a block is dependent on the size of the data register included within the flash memory controller 100. Similarly, block size is dependent on the architecture, as blocks comprise pages of data. For NAND-based architectures (i.e., NAND-based architecture flash memories), typical block sizes include: 32 pages of 512+16 bytes each for a block size of 16 KB; 64 pages of 2,048+64 bytes each for a block size of 128 KB; 64 pages of 4,096+128 bytes each for a block size of 256 KB; 128 pages of 4,096+128 bytes each for a block size of 512 KB; etc.

Figure 2:
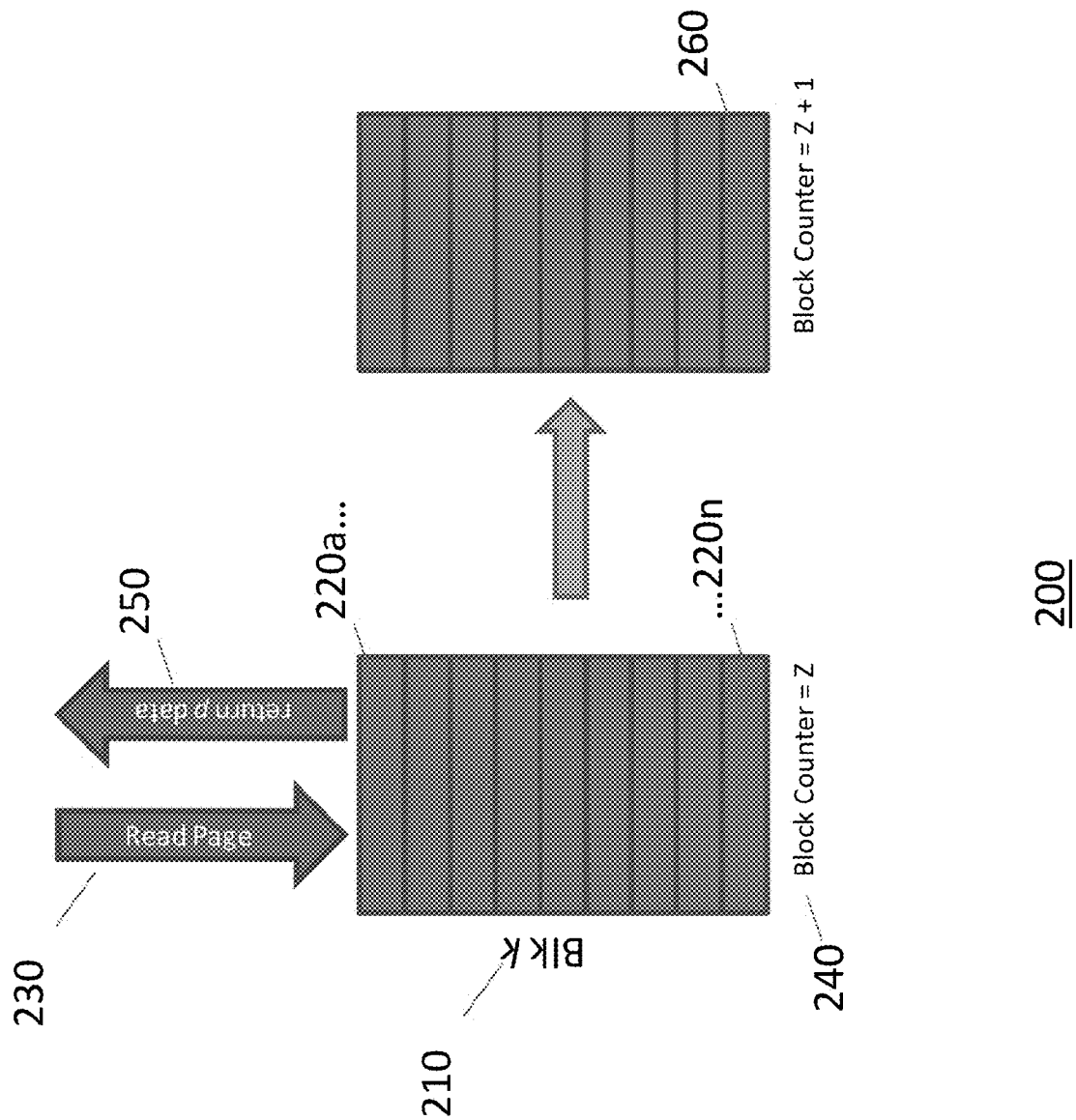
FIG. 2 sets forth a diagram of certain operations involving the block counter for the present invention.

FIG. 2 sets forth a diagram 200 of certain operations involving the block counter for the present invention. In FIG. 2, a block K 210 of data of n pages $220a \ldots 220n$ is depicted. An operational command of READ is instructed 230 and routed by the memory controller to the appropriate location of block K, where the associated page for the READ is located. The block counter has a value Z (240) that is associated with the number of prior READ counts or operational commands previously affecting block K. The block counter value of Z is identified by the present invention and is communicated to the memory controller.

The memory controller, using the method of the present invention in one or more embodiments, determines if the endurance limit value for the block K has not been reached and whether a block threshold value (associated with the endurance limit value) has been reached based on the clock counter value, further discussed below. Where these two conditions are satisfied, the memory controller returns 250 the page data by migrating the data of the page in block K to a new block location and advances the block counter value by one for block K at 260. In other situations, where the endurance limit value for the block K has been reached, the entire block is returned 250 and the entire block is migrated to a new location. In further situations, where the endurance limit value for the block K has not been reached and the block threshold value has not been reached, the memory controller returns 250 the page data, maintains the page data at block K, and advances the block counter value by one for block K at 260.

In one or more embodiments, the block threshold value is determined by the present invention as a function of the endurance limit value in a predetermined manner such that the block threshold value is preferably less than the endurance limit value. In a preferred embodiment, the block threshold value is equal to the endurance limit value less the product of a threshold factor and the number of pages per block, where the threshold factor may be of a value greater than zero. Preferably, though such is not required, a desirable threshold factor to deploy for the present invention may be in the range of 1 to 3 as it is desired to have the block threshold value be at a value less than the endurance limit value to provide the present invention to migrate one or more pages in a block to a new block before the block attains a block counter value equal to or near the endurance limit value. Contradistinctively, where the block threshold value does not provide for adequate opportunity for transfer of pages within a block over common usage patterns, a larger migration (i.e., greater number of data pages) would still be required to be transferred upon the block reaching the endurance limit value.

Figure 3:
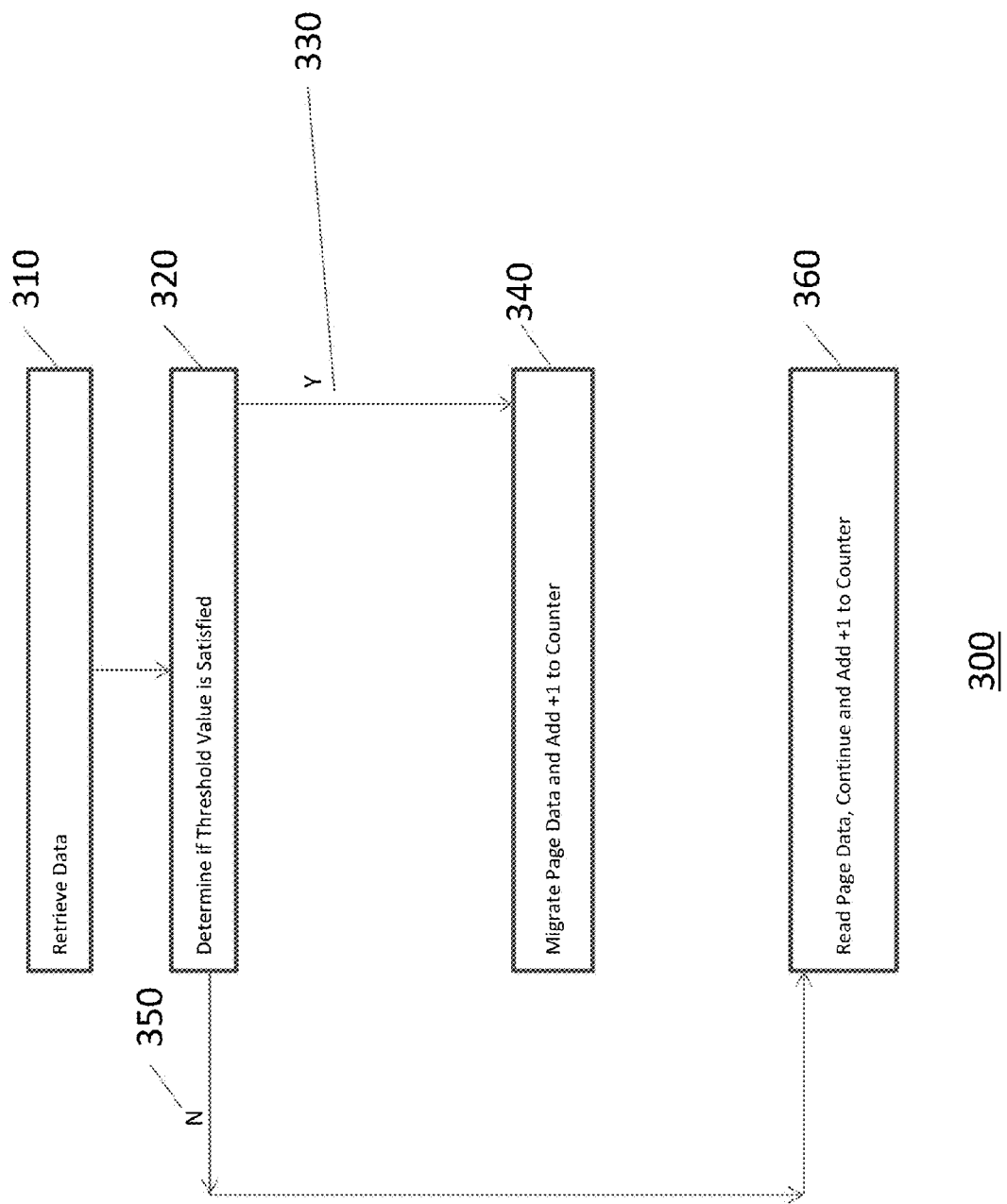
FIG. 3 illustrates a process decision flow for the present invention in accordance with one or more embodiments.

FIG. 3 illustrates a process decision flow 300 for the present invention in accordance with one or more embodiments. In FIG. 3, following an operational command, such as a READ, for a target page in a block, data is retrieved at 310. Data that is retrieved may include endurance limit value data, manufacturer's specification information, and similar relevant specification based information about the device. Other retrieved data may include block counter value for the number of operational command accesses associated with the subject block. Still further retrieved data may include threshold factor value or other custom data that may be used in the determination and processing of block threshold values for the device under the present invention.

From the retrieved data 310, the block threshold value is determined in relation to the endurance limit value and the threshold factor. Once determined, the block threshold value is compared with the block counter value to determine if the block threshold value has been reached 320. If the block counter value is equal to or greater than the block threshold value (330), then instructions are provided for migrating data of the target page (or pages) to a new block location (340) and the block counter value is increased by one. When the data is migrated the data does not need to be reread and this will lessen the performance impact of the algorithm on the storage system. If the block counter value is less than the block threshold value (350), then the page data is read and the block counter value is increased by one (360). Data of the target page (or pages) is migrated to a new block location (340). In operation, in one or more embodiments of the present invention, to obtain a partial-block migration (i.e., page(s) of migration to a new location but not the entirety of a block of data migration), the block counter value preferably does not equal or exceed the endurance limit value for the present invention.

In one or more preferred embodiments, the memory controller is comprised of one or more of hardware, software and firmware. For instance, the present invention may reside in the logic of the memory controller, be programmable, be in remotely located logic, be instructions in a memory or CPU, or be a combination of hardware, software and firmware, or any of the above, in communication with one another.

Additional benefits of the present invention include that by using an early migration strategy with the present invention for a NAND-based architecture device, other pages may be delayed in their migration and could be subject to a new write or replacement prior to a required or batch move, thereby avoiding the situation of moving invalid data and using resources unnecessarily.

Data that is retrieved may include endurance limit value data, manufacturer's specification information, and similar relevant specification based information about the device. Other retrieved data may include block counter value for the number of operational command accesses associated with the subject block. Still further retrieved data may include threshold factor value or other custom data that may be used in the determination and processing of block threshold values for the device under the present invention.

As will be appreciated by those skilled in the art, the block threshold value is determined by the present invention as a function of the endurance limit value. Preferably, the block threshold value is less than the endurance limit value. In a preferred embodiment, the block threshold value is equal to the endurance limit value less the product of a threshold factor and the number of pages per block, where the threshold factor may be of a value greater than zero.

By example, for the present invention in one or more embodiments, the block threshold value for a SLC flash having an endurance limit of 100 k with a block size of 512 KB (having 128 pages per block), may preferably be programmed or have a predetermined block threshold value to be 100,000−(128×2) or approximately 99,744. Similarly, for a block size of 1024 KB (having 256 pages per block), a block threshold value may be approximately 99,488. Operationally, the present invention once determining the block access count has achieved the predetermined block threshold value, would begin to undertake the process of having the selected page moved to a new block location. Upon a following occurrence of reading an additional selected target page of the same block, the additional selected target page would also be moved to new location block, where the process is repeated until the earlier of the endurance limit being achieved or each of all of the pages of the block are first moved by the present invention. It will be appreciated by those skilled in the art that the calculation set forth above is a preferred embodiment and various other approaches to determine, calculate and set a block threshold value as a function of the endurance limit may also be set forth within the scope of the present invention.

It will be appreciated to those skilled in the art having the benefit of this disclosure that this invention is believed to provide an improved flash memory device within improved performance and reliability. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

For NAND-based architecture flash memories, typical block sizes have been set forth to include the following, however the present invention is not so limited: 32 pages of 512+16 bytes each for a block size of 16 KB; 64 pages of 2,048+64 bytes each for a block size of 128 KB; 64 pages of 4,096+128 bytes each for a block size of 256 KB; 128 pages of 4,096+128 bytes each for a block size of 512 KB; etc.

Although the present invention has set forth a number of embodiments which may discuss NAND-based architectures, flash memories, non-volatile memories, etc., the present invention further contemplates and includes methods, applications, systems, apparatuses and memory devices in conjunction with other types of memories based on such formats such as static RAMs (SRAM) and the many different subspecies of DRAMs, including, by way of non-limiting examples, fast page mode DRAM (FPM DRAM), extended data out DRAM (EDO DRAM), burst EDO DRAM, synchronous DRAM (SDRAM), double data rate DRAM (DDR2 DRAM and DDR3 DRAM), Rambus DRAM (RDRAM), etc.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read. Various forms of computer readable media may be involved in carrying one or more sequences of one or more instructions to one or more processors in one or more preferred embodiments for execution.

What is claimed is:

1. A method of reducing read disturbance in a memory system comprising a flash memory having a NAND-based architecture, the method comprising:
    identifying a block counter value by reading the block counter of a block having a selected page to be READ, wherein the identifying the block counter further includes determining access count to the selected page to be READ,
    determining a block threshold value in relation to a read disturbance endurance limit value, wherein the block threshold value is a predetermined value, wherein the predetermined value is determined by subtracting a product of a page count value and a threshold factor from the read disturbance endurance limit value; and
    comparing if the block counter value is equal to or greater than the block threshold value, where if the current block counter value is greater than or equal to the block threshold value, then moving the selected page to a new block location.

2. The method of claim 1, further comprising updating a new physical location associated with a new block for the selected page as moved.

3. The method of claim 1, further comprising performing an operational command for the selected page.

4. The method of claim 1, wherein the threshold factor is between 1 and 3.

5. The method of claim 1, further comprising performing an operational command for the one or more pages where the block counter value is less than the block threshold value.

6. The method of claim 5, further comprising adding +1 to the block counter value.

7. A method of reducing read disturbance in a memory device having a NAND-based architecture, the method comprising:
    identifying a block counter value of a block having a selected page to be READ to be less than a read disturbance endurance limit value,
    determining a block threshold value in relation to the read disturbance endurance limit value, wherein the block threshold value is determined by subtracting a product of a page count value and a threshold factor from the read disturbance endurance limit value;
    comparing the block counter value to the block threshold value; and either:
    performing a move operation on the selected page to a new block location if the block counter value is greater than or equal to the block threshold value; or,
    otherwise performing an operational command on the selected page and updating the block counter value by one.

8. The method of claim 7, wherein the performing a move operation on the selected page to a new block location if the current block counter value is greater than or equal to the block threshold value further includes updating the block counter value by one.

9. The method of claim 8, further comprising updating a new physical location associated with the new block location for the moved selected page.

10. The method of claim 9, further comprising performing an operational command on the moved selected page.

11. The method of claim 10, wherein the identifying the block counter further includes determining access to the selected page.

12. The method of claim 7, wherein the threshold factor ranges from 1 to 3.

13. The method of claim 7, wherein the threshold factor is approximately 1.

14. A flash memory system having a NAND-based architecture configured for reducing read disturbance, comprising:
    a memory device coupled to a memory controller, wherein the memory device includes a plurality of non-volatile memory storage cells, and the memory controller is further configured to be determined by subtracting a product of a page count value and a threshold factor from the read disturbance endurance limit value,
    a counter configured to provide a block counter value of a number of times a block having a selected page is accessed for an operational command,
    a read disturbance endurance limit value resident in the memory device and associated with a performance of the memory device; and
    a memory controller configured to identify the block counter value, identify the read disturbance endurance limit value, compare the block threshold value and the read disturbance endurance limit value, and either: perform a move operation on the selected page to a new block location if the block counter value is greater than or equal to the block threshold value; or, perform an operational command on the selected page; and update the block counter value by one.

15. The flash memory system of claim 14, wherein the threshold factor is between 1 and 3.

16. The flash memory system of claim 14, wherein the memory controller is comprised of one or more of hardware, software and firmware.

17. The flash memory system of claim 14, wherein the memory controller is a programmable controller.

18. The flash memory system of claim 14, wherein the operational command is READ.

19. The flash memory system of claim 14, wherein the block counter value is associated with the access count to the selected page to be READ.

20. The flash memory system of claim 14, wherein the flash system is one of a: memory card, Universal Serial Bus (USB) flash drive, solid-state drive, flash memory module, personal computer, PDA, digital audio player, digital camera, mobile phone, synthesizer, solid state storage, video game, scientific instrumentation, industrial robotic device, medical electronic apparatus, and router.

* * * * *